(12) United States Patent
Hori

(10) Patent No.: US 7,547,580 B2
(45) Date of Patent: Jun. 16, 2009

(54) METHOD FOR MANUFACTURING A SEMICONDUCTOR WIRING BASE THAT INCLUDES A WIRING BASE WITH WIRING EXTENDING INSIDE AND OUTSIDE OF A MOUNTING REGION

(75) Inventor: Toshiyuki Hori, Sakata (JP)

(73) Assignee: Seiko Epson Corporation (JP)

( * ) Notice: Subject to any disclaimer, the term of this patent is extended or adjusted under 35 U.S.C. 154(b) by 13 days.

(21) Appl. No.: 11/879,993

(22) Filed: Jul. 19, 2007

(65) Prior Publication Data

US 2008/0014683 A1 Jan. 17, 2008

Related U.S. Application Data

(62) Division of application No. 10/948,075, filed on Sep. 23, 2004, now Pat. No. 7,262,496.

(30) Foreign Application Priority Data

Sep. 24, 2003 (JP) ............................. 2003-331492

(51) Int. Cl.
*H01L 21/58* (2006.01)
(52) U.S. Cl. ................. 438/118; 438/126; 257/E21.511
(58) Field of Classification Search ................. 361/774, 361/775
See application file for complete search history.

(56) References Cited

U.S. PATENT DOCUMENTS

| 5,252,853 | A | 10/1993 | Michii |
| 6,462,522 | B2 | 10/2002 | Burstein et al. |
| 6,476,467 | B2 | 11/2002 | Nakamura et al. |

FOREIGN PATENT DOCUMENTS

| JP | 05-082585 | 4/1993 |
| JP | 2000-340934 | 12/2000 |
| JP | 2001-237265 | 8/2001 |
| JP | 2001-284413 | 10/2001 |

OTHER PUBLICATIONS

Communication from Japanese Patent Office re: counterpart application, Feb. 2, 2005.

*Primary Examiner*—Stephen W Smoot
(74) *Attorney, Agent, or Firm*—Harness, Dickey & Pierce, P.L.C.

(57) ABSTRACT

A method for manufacturing a semiconductor device is provided. A resin paste is applied to a wiring base including a wiring pattern. Then, a semiconductor chip having a plurality of electrodes is mounted to the wiring base. The electrodes and the wiring pattern face one another and are electrically connected. The wiring base and the semiconductor chip are bonded by curing the resin paste. The wiring pattern includes a wiring that continuously includes two or more first parts located inside a semiconductor chip mounting region and a second part that connects at least two of the first parts. The second part is located outside the semiconductor chip mounting region.

13 Claims, 4 Drawing Sheets

METHOD FOR MANUFACTURING A SEMICONDUCTOR WIRING BASE THAT INCLUDES A WIRING BASE WITH WIRING EXTENDING INSIDE AND OUTSIDE OF A MOUNTING REGION

RELATED APPLICATIONS

This is a divisional application of U.S. Ser. No. 10/948,075 filed Sep. 23, 2004 and issued as U.S. Pat. No. 7,262,496, which claims priority to Japanese Patent Application No. 2003-331492 filed Sep. 24, 2003 all of which are hereby expressly incorporated by reference herein in their entirety.

BACKGROUND

1. Field of the Invention

The present invention relates to a wiring base, a semiconductor device, a manufacturing method thereof and electronic equipment.

2. Background

The use of resin paste to bond a semiconductor chip to a wiring base is known. It is also known that the semiconductor chip is mounted after applying the resin paste to the wiring base. At this time, if no voids remain between the wiring base and the semiconductor chip, the reliability of the resulting semiconductor device is improved.

The present invention aims to provide a highly-reliable semiconductor device, a manufacturing method thereof and electronic equipment.

SUMMARY

A method for manufacturing a semiconductor device according to a first aspect of the invention includes a step of providing a resin paste to a wiring base including a wiring pattern, a step of mounting a semiconductor chip including a plurality of electrodes to a semiconductor chip mounting region of the wiring base such that the electrodes and the wiring pattern face each other and are electrically coupled, and a step of curing the resin paste so as to bond the wiring base and the semiconductor chip. The wiring pattern includes a continuous wiring that includes more than one first part located inside the semiconductor chip mounting region, and a second part that connects at least two of the first parts. The second part is located outside the semiconductor chip mounting region. According to the first aspect of the invention, the wiring pattern includes more than one first part located inside the semiconductor chip mounting region and a second part that connects at least two of the first parts but is located outside the semiconductor chip mounting region. Thus, the second part is located outside the semiconductor chip mounting region. This makes it easy to flow the resin paste when the semiconductor chip is mounted. This can prevent voids from remaining between the wiring base and the semiconductor chip, thereby enabling a highly-reliable semiconductor device to be manufactured.

In the method for manufacturing a semiconductor device, an outline of the semiconductor chip mounting region is a rectangle. Each of the first parts may extend in a direction intersecting a long side of the outline of the semiconductor chip mounting region. This makes it easy to flow the resin paste in a direction along a short side of the outline of the semiconductor chip mounting region. Consequently, this makes it possible to easily fill resin paste between the semiconductor chip and the wiring base, thereby enabling a highly-reliable semiconductor device to be manufactured.

In the method for manufacturing a semiconductor device, each of the first parts may extend in a direction that is parallel with the short side of the outline of the semiconductor chip mounting region. This makes it easy to flow the resin paste in a direction along the short side of the outline of the semiconductor chip mounting region. Consequently, this makes it possible to easily fill resin paste between the semiconductor chip and the wiring base, thereby enabling a highly-reliable semiconductor device to be manufactured.

In the method for manufacturing a semiconductor device, the resin paste may be provided in a shape that extends along the long side of the semiconductor chip mounting region. This makes it easier to fill resin paste between the semiconductor chip and the wiring base, thereby enabling a highly-reliable semiconductor device to be manufactured.

The method for manufacturing a semiconductor device of a second aspect of the invention includes a step of providing a resin paste to a wiring base including a wiring pattern, a step of mounting a semiconductor chip including a plurality of electrodes to a semiconductor chip mounting region of the wiring base such that the electrodes and the wiring pattern face each other and are electrically coupled, and a step of curing the resin paste so as to bond the wiring base and the semiconductor chip. The wiring pattern includes a wiring that is formed so as to enter the semiconductor chip mounting region from an outside, bend therein, and exit to the outside again. The wiring is formed such that the number of bends that form an acute angle is not more than one. According to the second aspect of the invention, the wiring pattern includes wiring that is formed such that the number of bends that form an acute angle is not more than one inside the semiconductor chip mounting region. This makes it easy to flow the resin paste inside the semiconductor chip mounting region when the semiconductor chip is mounted. This can prevent voids from remaining between the wiring base and the semiconductor chip, thereby enabling a highly-reliable semiconductor device to be manufactured.

In the method for manufacturing a semiconductor device, an outline of the semiconductor chip mounting region is a rectangle. The resin paste may be provided in a shape that extends along a long side of the semiconductor chip mounting region. This makes it easier to fill resin paste between the semiconductor chip and the wiring base, thereby enabling a highly-reliable semiconductor device to be manufactured.

In the method for manufacturing a semiconductor device, the resin paste may be provided at a center part of the semiconductor chip mounting region.

The semiconductor device of a third aspect of the invention is manufactured by the above-mentioned methods.

Electronic equipment of a fourth aspect of the invention includes the above-mentioned semiconductor device.

The wiring base of a fifth aspect of the invention includes a base substrate having an electronic element mounting region, and a wiring pattern formed on the base substrate. The wiring pattern includes a continuous wiring that includes more than one first parts located inside the electronic element mounting region, and a second part that connects at least two of the first parts. The second part is located outside the electronic element mounting region. According to the fifth aspect of the invention, the wiring pattern includes more than one first part located inside the electronic element mounting region and a second part that connects at least two of the first parts but is located outside the electronic element mounting region. Thus, the second part is located outside the electronic element mounting region. This makes it easy to flow the resin paste inside the electronic element mounting region when the electronic element is mounted. As a result, it is possible to provide a highly-reliable wiring base with few voids remaining between the electronic element and the wiring base.

In the wiring base, an outline of the electronic element mounting region is a rectangle. Each of the first parts may extend in a direction intersecting a long side of the outline of the electronic element mounting region. This makes it easy to flow the resin paste in a direction along a short side of the outline of the electronic element mounting region. As a result, it is possible to provide a highly-reliable wiring base with few voids remaining between the electronic element and the wiring base.

In the wiring base, each of the first parts may extend in a direction that is parallel with the short side of the outline of the electronic element mounting region. This makes it easy to flow the resin paste in a direction along the short side of the outline of the electronic element mounting region. As a result, it is possible to provide a highly-reliable wiring base with few voids remaining between the electronic element and the wiring base.

The wiring base of a sixth aspect of the invention includes a base substrate having an electronic element mounting region, and a wiring pattern formed on the base substrate. The wiring pattern includes a wiring that is formed so as to enter the electronic element mounting region from an outside, bend therein, and exit to the outside again. The wiring is formed such that the number of bends that form an acute angle is not more than one. According to the sixth aspect of the invention, the wiring pattern includes the wiring that is formed such that the number of bends that form an acute angle is not more than one inside the electronic element mounting region. This makes it easy to flow the resin paste inside the electronic element mounting region when the electronic element is mounted. As a result, it is possible to provide a highly-reliable wiring base with few voids remaining between the electronic element and the wiring base.

DETAILED DESCRIPTION

Embodiments according to the invention will now be explained with reference to the drawings. However, the present invention is not limited to the embodiments below.

First Embodiment

FIGS. 1 through 5 are diagrams explaining a manufacturing method for a semiconductor device according to a first embodiment of the invention.

The manufacturing method for a semiconductor device of the first embodiment includes a preparation of a wiring base 10. (Refer to FIG. 1)

Figure 1:
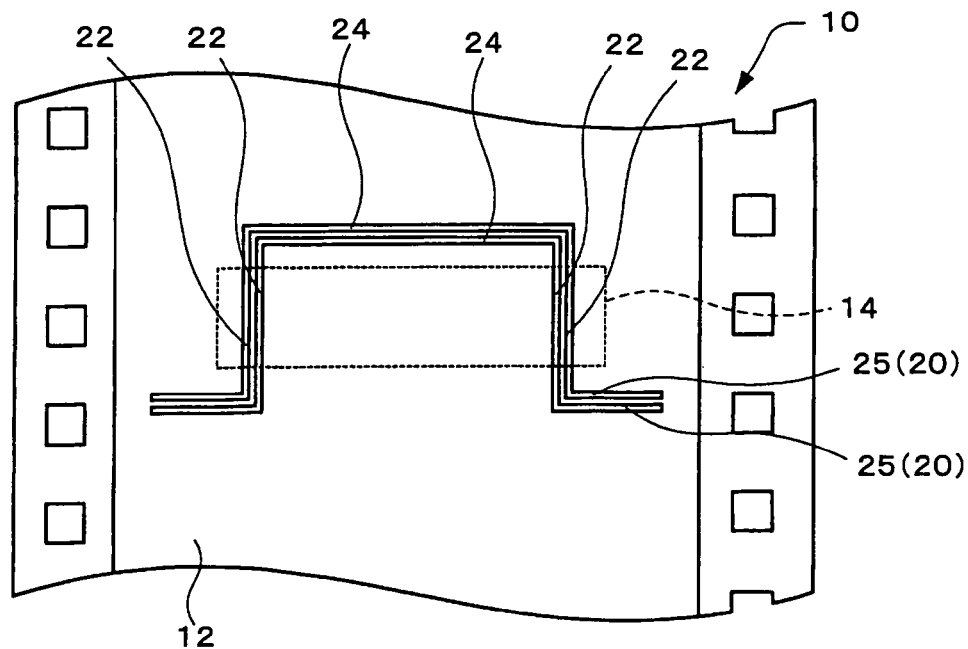
FIG. 1 is a diagram illustrating a manufacturing method for a semiconductor device according to a first embodiment of the invention.

The wiring base 10 includes a base substrate 12. The base substrate 12 may be made of either organic materials or inorganic materials, or a composite structure of these materials. As for the base substrate 12 made of an organic material, a flexible substrate made of a polyimide resin is exemplified. For the flexible substrate, a tape used in a FPC (Flexible Printed Circuit) and COF (Chip On Film) mount may be employed. For the base substrate 12 made of an inorganic material, a ceramic substrate and a glass substrate are exemplified. As shown in FIG. 1, an overall shape of the base substrate 12 may be tape like. However, the base substrate 12 of the invention is not limited to the tape like substrate.

The base substrate 12 includes a semiconductor chip mounting region 14. An outline of the semiconductor chip mounting region 14 is not limited to any specified shape. A rectangle may be applicable. The outline of the semiconductor chip mounting region 14 may be congruent with a planar shape of a semiconductor chip mounted thereon. The semiconductor chip mounting region 14 is provided in one or multiple numbers in the region of the base substrate 12 in which one semiconductor device is formed.

The wiring base 10 includes a wiring pattern 20. The wiring pattern 20 is formed on the base substrate 12. The wiring pattern 20 is formed by single layer of or multilayer of, for example, any of copper (Cu), chromium (Cr), titanium (Ti), nickel (Ni), titanium tungsten (Ti—W), gold (Au), aluminum (Al), nickel vanadium (Ni—V), and tungsten (W). The wiring pattern 20 may be bonded to the base substrate 12 with an adhesive member (not shown) so as to form a three-layer substrate (or three-layer tape). In addition, the wiring pattern 20 may be formed on the base substrate without the adhesive so as to form a two-layer substrate (or two-layer tape). Forming methods for the wiring pattern 20 are not limited to any specified methods. For example, the wiring pattern 20 may be formed by sputtering or the like. Also, the wiring pattern 20 may be formed by applying an additive method using electroless plating. In addition, the wiring pattern 20 may be formed by etching a metal foil. The wiring pattern 20 may be plated with solder, tin, gold, and nickel or the like. A lead for plating (not shown) may also be formed on the base substrate 12. The lead for plating may be formed so as to be electrically connected to the wiring pattern 20. This makes it possible to carry out plating to the wiring pattern 20 with the lead for plating.

The wiring pattern 20 includes a wiring 25. The wiring 25 may, for example, be a power supply line and a ground line. The wiring 25 includes two or more first parts 22 located inside the semiconductor chip mounting region 14. The wiring 25 includes a second part 24 located outside the semiconductor chip mounting region 14. The second part 24 connects at least two of the first parts 22. As shown in FIG. 1, the second part 24 may connect two of the first parts 22. Also, the second part 24 may connect more than two of the first parts 22 (not shown). The wiring 25 is continuous in that it continuously includes the first parts 22 and the second part 24. In other words, the wiring pattern 20 includes the wiring 25 that continuously includes two or more first parts 22 located inside the semiconductor chip mounting region 14 and the second part 24 that connects at least two of the first parts 22 and is located outside the semiconductor chip mounting region 14. Since the second part 24 is located outside the semiconductor chip mounting region 14, the second part 24 does not block a flow of the resin paste inside the region 14. This makes it easy to flow a resin paste 30 inside the semiconductor chip mounting region 14 in a process for mounting a semiconductor chip 40, which will be described later. This makes it difficult for voids to remain between the wiring base 10 and the semiconductor chip 40, thereby enabling a highly-reliable semiconductor device to be manufactured.

The outline of the semiconductor chip mounting region 14 may be a rectangle. In this case, each of the first parts 22 may extend in a direction intersecting a long side of the outline of the semiconductor chip mounting region 14. Also, each of the first parts 22 may extend in a direction parallel with a short side of the outline of the semiconductor chip mounting region 14. This enables the resin paste to flow in the short side direction of the outline of the semiconductor chip mounting region 14. This makes it difficult for voids to remain in the semiconductor chip mounting region 14, thereby enabling a highly reliable semiconductor device to be manufactured.

The wiring base 10 may include a protection layer (not shown). The protection layer can prevent the wiring pattern 20 from corrosion or an electrical short, thereby enabling a highly-reliable semiconductor device to be manufactured. In this case, the protection layer may include an opening. The opening may be located so as to overlap the semiconductor chip mounting region 14. This enables the wiring pattern 20 and the semiconductor chip 40 to be electrically connected.

Electronic elements other than the semiconductor chip may be mounted to the wiring base 10. In this case, the same effect as that described above also can be achieved for making it difficult for voids to remain between the wiring base 10 and the electronic element, thereby enabling a highly-reliable electronic equipment to be manufactured. For the electronic elements other than the semiconductor chip, a capacitor or the like are exemplified.

Figure 2:
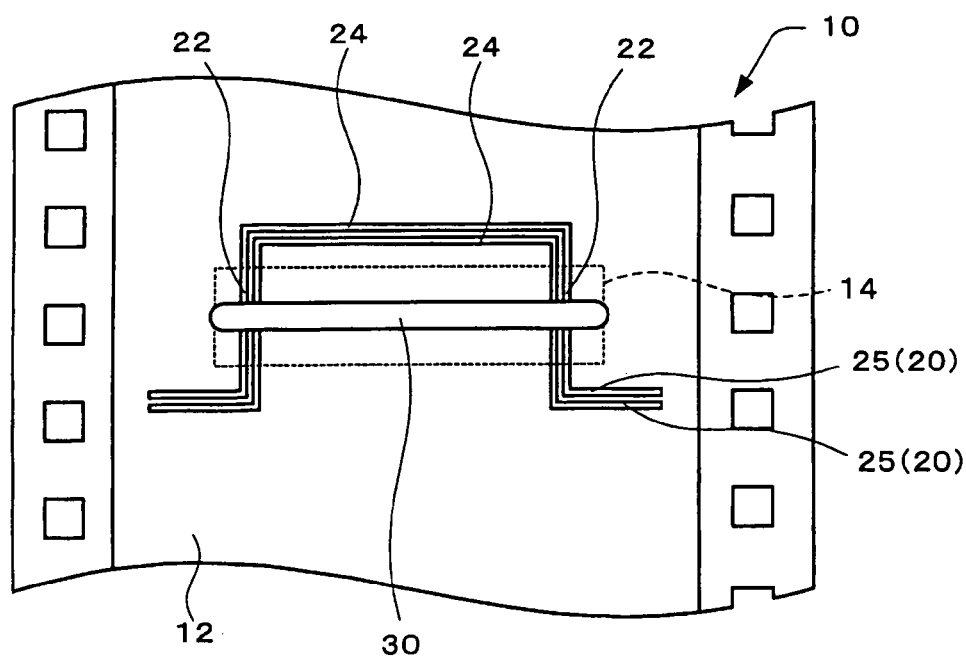
FIG. 2 is a diagram illustrating the manufacturing method for a semiconductor device according to the first embodiment of the invention.

As shown in FIG. 2, the method for manufacturing a semiconductor device of the embodiment includes providing the resin paste 30 to the wiring base 10. Materials for the resin paste 30 are not limited to any specified materials. For example, an epoxy resin may be employed. The resin paste 30 may be a non-conductive paste (NCP) or an anisotropic conductive paste (ACP) including conductive particles (not shown). The resin paste 30 may be provided at a center part of the semiconductor chip mounting region 14. This enables the resin paste 30 to flow when the semiconductor chip 40 is mounted, thereby making it difficult for voids to remain between the wiring base 10 and the semiconductor chip 40. In addition, if the outline of the semiconductor chip mounting region 14 is a rectangle, the resin paste 30 may be applied in the shape extending along the long side of the outline of the semiconductor chip mounting region 14 as shown in FIG. 2. Thus, the resin paste 30 is not required to flow along the long side direction of the outline of the semiconductor chip mounting region 14. This makes it easy to fill the resin paste 30 between the wiring base 10 and the semiconductor chip 40. However, aside from this, the resin paste 30 may be applied so as to cover the semiconductor chip mounting region 14.

Figure 3:
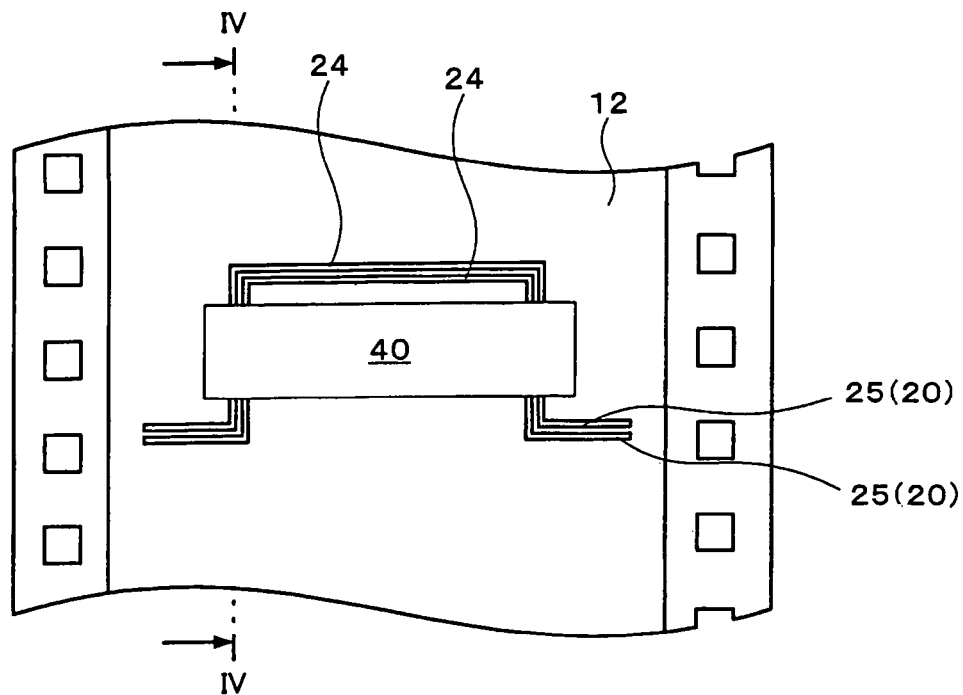
FIG. 3 is a diagram illustrating the manufacturing method for a semiconductor device according to the first embodiment of the invention.
Figure 4:
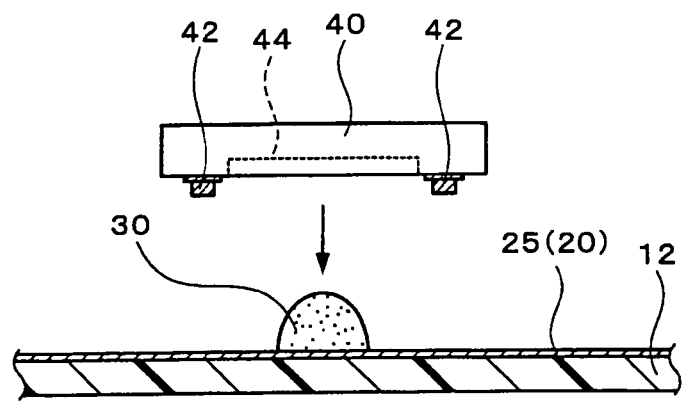
FIG. 4 is a diagram illustrating the manufacturing method for a semiconductor device according to the first embodiment of the invention.
Figure 5:
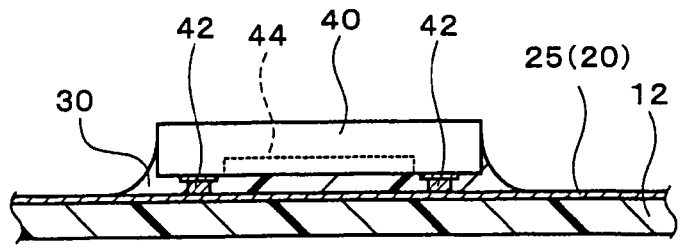
FIG. 5 is a diagram illustrating the manufacturing method for a semiconductor device according to the first embodiment of the invention.

As shown in FIG. 3 and FIG. 4, the method for manufacturing a semiconductor device of the embodiment includes mounting the semiconductor chip 40 having a plurality of electrodes 42 to the wiring base 10. FIG. 4 is a partially enlarged diagram of the sectional view taken along line IV-IV in FIG. 3. The semiconductor chip 40 is mounted to the semiconductor chip mounting region 14 of the wiring base 10. This process is carried out after the process that the resin paste 30 is applied to the wiring base 10.

As above-mentioned, since the wiring pattern 20 including the wiring 25 is formed on the wiring substrate 10, the resin paste 30 easily flows on the wiring base 10. Since the semiconductor chip 40 is mounted after applying the resin paste 30, the resin paste 30 flows toward an edge of the semiconductor chip mounting region 14. If the resin paste 30 is applied at the center part of the semiconductor chip mounting region 14, the resin paste 30 easily flows. This can prevent voids from remaining between the wiring base 10 and the semiconductor chip 40, thereby enabling a highly-reliable semiconductor device to be manufactured.

The semiconductor chip 40 may include an integrated circuit 44 formed by transistors and memory elements or the like. (Refer to FIG. 4) The electrodes 42 may be electrically connected to the inside of the semiconductor chip 40. Each of the electrodes 42 may include, for example, a pad and a bump provided to the pad. In the embodiment shown in FIG. 5, the electrodes 42 and the wiring pattern 20 face each other and are electrically connected. The electrodes 42 and the wiring pattern 20 may be electrically connected with a contact therebetween. (Refer to FIG. 5) Moreover, if ACP is employed as the resin paste 30, conductive particles may be provided between the electrodes 42 and the wiring pattern 20 so as to achieve an electrical connection therebetween with the conductive particles. A planar shape of the semiconductor chip 40 is not limited to any specified shape. A rectangle may be applicable.

The method for manufacturing a semiconductor device of the embodiment includes the process in which the wiring base 10 and the semiconductor chip 40 are bonded by curing the resin paste 30. The process for curing the resin paste 30 (a heat treatment, an ultraviolet ray irradiation or the like) may be carried out so as to bond the wiring base 10 and the semiconductor chip 40 after mounting the semiconductor chip 40 to the wiring base 10. Alternatively, the process for mounting the semiconductor chip 40 to the wiring base 10 and the process for curing the resin paste 30 may be carried out simultaneously. For example, if a thermosetting resin is employed as the resin paste 30, these two processes may be carried out simultaneously by mounting the semiconductor chip while heating the resin.

Figure 6:
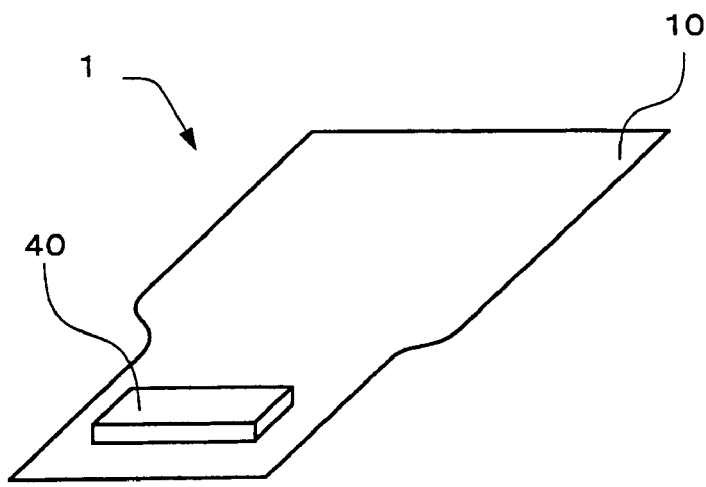
FIG. 6 is a diagram illustrating a semiconductor device according to the first embodiment of the invention.

Subsequently, an inspection process, a process for cutting the wiring base 10 or the like may be carried out to manufacture the semiconductor device 1 shown in FIG. 6.

Second Embodiment

Figure 7:
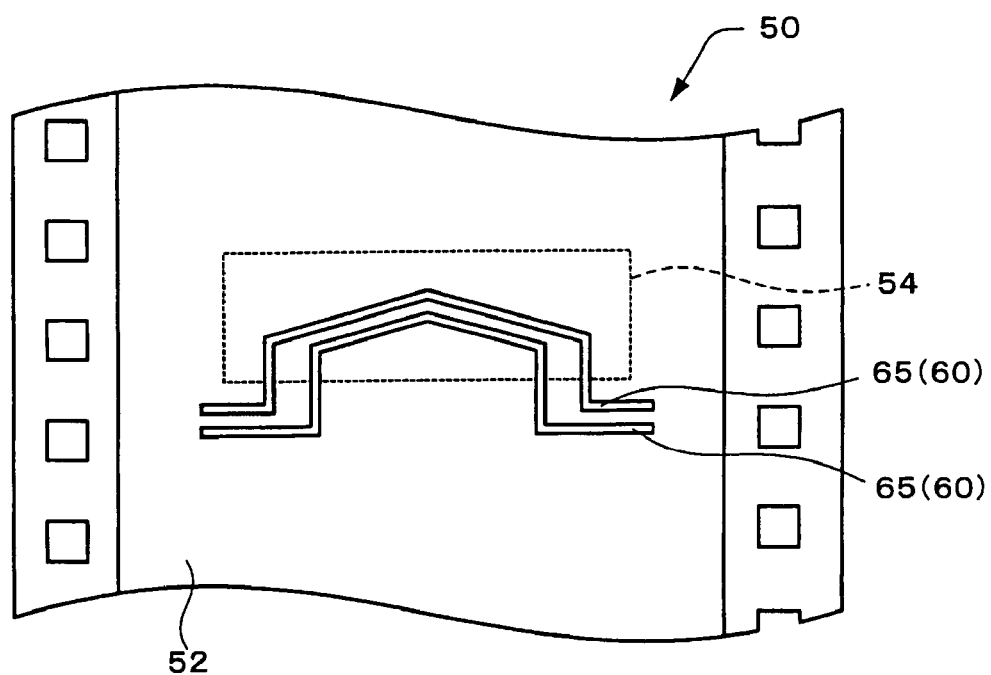
FIG. 7 is a diagram illustrating a manufacturing method for a semiconductor device according to a second embodiment of the invention.

FIG. 7 is a diagram explaining a manufacturing method for a semiconductor device according to a second embodiment of the invention. In this embodiment, aforementioned explanations are applied as often as possible.

The manufacturing method for a semiconductor device of this embodiment includes preparing a wiring base 50 as shown in FIG. 7. The wiring base 50 includes a base substrate 52 including a semiconductor chip mounting region 54, and a wiring pattern 60 formed on the base substrate 52. The wiring pattern 60 includes a wiring 65. The wiring 65 is formed so as to enter the semiconductor chip mounting region 54 from an outside, bend therein, and exit to the outside again. The wiring 65 is formed such that the number of bends that form an acute angle is not more than one. Thus, the wiring 65 is formed such that the number of bends that form an acute angle is not more than one inside the semiconductor chip mounting region 54. The same materials and forming methods for the wiring pattern 60 can be applied as those of the aforementioned explanations of the wiring pattern 20. For the base substrate 52, the aforementioned explanations of the base substrate 12 can be applied.

Subsequently, a process for applying the resin paste to the wiring base 50, a process for mounting a semiconductor chip having a plurality of electrodes to the wiring base 50, and a process for curing the resin paste so as to bond the wiring base 50 and the semiconductor chip may be carried out so as to manufacture the semiconductor device. (Refer to FIG. 6).

As above-mentioned, the wiring base 50 includes the wiring pattern 60. The wiring pattern 60 includes the wiring 65. The wiring 65 is formed so as to enter the semiconductor chip mounting region 54 from an outside, bend therein, and exit to the outside again. The wiring 65 is formed such that the number of bends that form an acute angle is not more than one. This prevents a flow direction of the resin paste from being largely changed inside the semiconductor chip mounting region 54. This makes it easy to flow the resin paste on the wiring base 50. This makes it difficult for voids to remain between the wiring base and the semiconductor chip, thereby enabling a highly-reliable semiconductor device to be manufactured.

Figure 8:
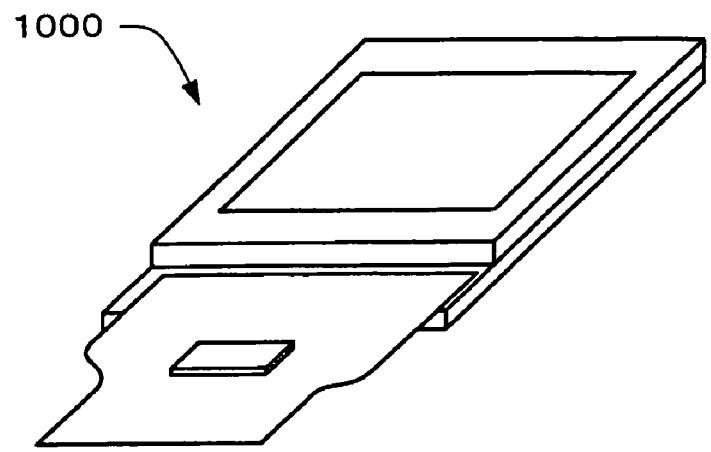
FIG. 8 is a diagram illustrating a display device including a semiconductor device according to the embodiments of the invention.
Figure 9:
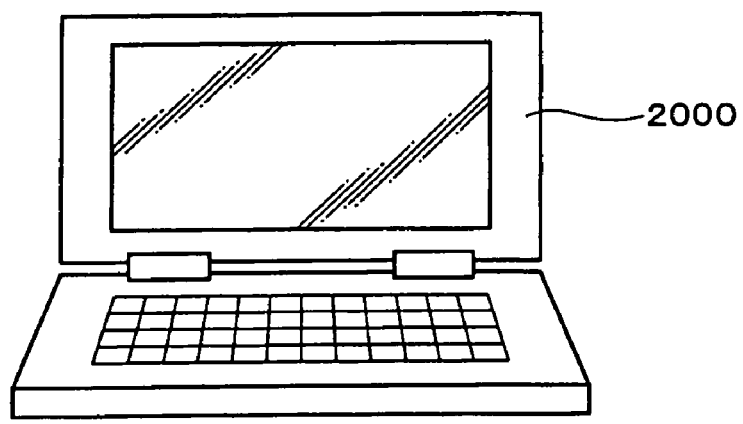
FIG. 9 is a diagram illustrating electronic equipment including a semiconductor device according to the embodiments of the invention.
Figure 10:
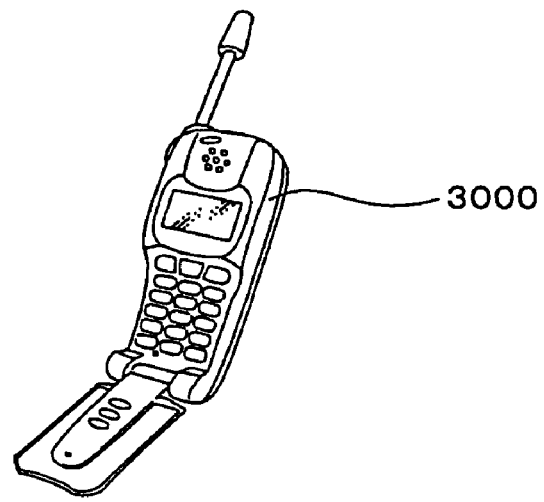
FIG. 10 is a diagram illustrating electronic equipment including a semiconductor device according to the embodiments of the invention.

FIG. 8 shows a display device 1000 including a semiconductor device according to the embodiments of the invention. For the display device 1000, a liquid crystal display or an electrical luminescence (EL) display device may be exemplified. For electronic equipment including a semiconductor device according to the embodiments of the invention, a notebook type personal computer 2000 is shown in FIG. 9 and a cellular phone 3000 is shown in FIG. 10.

The present invention is not limited to the above-mentioned embodiments. Various changes can be made. For example, the present invention includes constructions that are substantively the same as those of described in the above embodiments (for example, constructions including the same functions, methods, and results or constructions including the same aims and results). Also, the present invention includes constructions wherein nonessential parts of the constructions described in the above embodiments are replaced. In addition, the present invention includes constructions achieving the same aims as those of the constructions described in the above embodiments. Further, the present invention includes constructions in which related arts are added to the constructions described in the above embodiments.

What is claimed is:

1. A method for manufacturing a semiconductor device, comprising:
   providing a resin paste to a wiring base on which a first portion of a wiring pattern is provided in a semiconductor chip mounting region of the wiring base;
   mounting a semiconductor chip including a plurality of electrodes in the semiconductor chip mounting region after the providing the resin paste such that the plurality of electrodes and the first portion of the wiring pattern face each other and are electrically coupled; and
   curing the resin paste so as to bond the wiring base and the semiconductor chip;
   wherein the wiring pattern includes a wiring that includes more than one first part located inside the semiconductor chip mounting region and a second part that connects at least two of the first parts; and
   the second part is located outside the semiconductor chip mounting region.

2. The method for manufacturing a semiconductor device according to claim 1, wherein:
   an outline of the semiconductor chip mounting region is a rectangle; and
   each of the first parts extends in a direction intersecting a long side of the outline of the semiconductor chip mounting region.

3. The method for manufacturing a semiconductor device according to claim 2, wherein
   each of the first parts extends in a direction that is parallel with a short side of the outline of the semiconductor chip mounting region.

4. The method for manufacturing a semiconductor device according to claim 2, wherein
   the resin paste is provided in a shape that extends in parallel with the long side of the semiconductor chip mounting region.

5. The method for manufacturing a semiconductor device according to claim 1, wherein:
   an outline of the semiconductor chip mounting region is a rectangle; and
   each of the first parts extends through the semiconductor chip mounting region in a direction that is parallel with a short side of the outline of the semiconductor chip mounting region.

6. The method of manufacturing a semiconductor device according to claim 1, wherein an outline of the semiconductor chip mounting region is a rectangle, and wherein the providing the resin paste includes providing the resin paste in a shape that extends in a direction that is parallel with a long side of the outline of the semiconductor chip mounting region.

7. A method for manufacturing a semiconductor device, comprising:
   providing a resin paste to a wiring base on which a first portion of a wiring pattern is provided in a semiconductor chip mounting region of the wiring base;
   mounting a semiconductor chip including a plurality of electrodes in the semiconductor chip mounting region after the providing the resin paste such that the plurality of electrodes and the first portion of the wiring pattern face each other and are electrically coupled; and
   curing the resin paste so as to bond the wiring base and the semiconductor chip;
   wherein the wiring pattern includes a wiring that enters the semiconductor chip mounting region from outside, bends the semiconductor chip mounting region, and exits to the outside again; and
   the wiring is formed such that a number of bends that form an acute angle in the semiconductor chip mounting region is not more than one.

8. The method for manufacturing a semiconductor device according to claim 7, wherein:
   an outline of the semiconductor chip mounting region is a rectangle; and
   the resin paste is provided in a shape that extends along a long side of the semiconductor chip mounting region.

9. The method for manufacturing a semiconductor device according to claim 8, wherein:
   the resin paste is provided at a center part of the semiconductor chip mounting region.

10. The method for manufacturing a semiconductor device according to claim 7, wherein an outline of the semiconductor chip mounting region is a rectangle, and wherein the providing the resin paste includes providing the resin paste in a shape that extends along a long side of the outline of the semiconductor chip mounting region.

11. A method for manufacturing a semiconductor device, comprising:

provanding a resin paste to a wiring base on which a first portion of a wiring pattern is provided in a first region of the wiring base, the wiring pattern including a wiring that has a first part, a second part, and a third part between the first part and the second part, the first part overlapping an outline of the first region, the second part overlapping the outline of the first region, the third part bending in the first region;

mounting a semiconductor chip including an electrode in the first region after the providing the resin paste such that the electrode and the first portion of the wiring pattern face each other and are electrically coupled; and curing the resin paste so as to bond the wiring base and the semiconductor chip, wherein the wiring is formed such that a number of bends of the third part that form an acute angle in the first region is not more than one.

12. The method for manufacturing a semiconductor device according to claim 11, wherein the outline of the first region is a rectangle, and wherein the providing the resin paste includes providing the resin paste in a shape that extends along a long side of the outline of the first region.

13. The method for manufacturing a semiconductor device according to claim 12, wherein the resin paste is provided at a center part of the first region in the providing the resin paste in the shape.

* * * * *